(12) United States Patent
Fujii et al.

(10) Patent No.: US 7,308,999 B2
(45) Date of Patent: Dec. 18, 2007

(54) DIE BONDING APPARATUS

(75) Inventors: Toshihiko Fujii, Kobe (JP); Takashi Ohta, Kobe (JP); Shinichi Sugiura, Kobe (JP); Toshimasa Akamatsu, Ritto (JP); Katsufumi Morimune, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 36 days.

(21) Appl. No.: 10/739,211

(22) Filed: Dec. 19, 2003

(65) Prior Publication Data

US 2004/0129758 A1    Jul. 8, 2004

Related U.S. Application Data

(62) Division of application No. 10/207,964, filed on Jul. 31, 2002, now Pat. No. 6,708,862.

(30) Foreign Application Priority Data

Aug. 1, 2001 (JP) ............................. 2001-233423

(51) Int. Cl.
*B23K 37/04* (2006.01)
(52) U.S. Cl. .................... 228/4.1; 228/6.2; 156/358
(58) Field of Classification Search ................ 228/4.1, 228/5.5, 6.1, 6.2, 49.1, 49.5; 156/358, 556
See application file for complete search history.

(56) References Cited

U.S. PATENT DOCUMENTS

| | | | |
|---|---|---|---|
| 4,868,974 A | 9/1989 | Nishiguchi | 29/740 |
| 5,332,463 A * | 7/1994 | Eberlein et al. | 156/556 |
| 5,372,296 A * | 12/1994 | Konecke et al. | 228/124.6 |
| 5,398,404 A | 3/1995 | Meyer et al. | 29/732 |
| 5,556,024 A | 9/1996 | Olson et al. | 228/264 |
| 5,895,554 A | 4/1999 | Gordon | 156/556 |
| 6,328,196 B1 | 12/2001 | Imanishi et al. | 228/9 |
| 6,435,378 B1 * | 8/2002 | Aptekman | 222/454 |
| 6,450,039 B1 * | 9/2002 | Masuda | 73/756 |
| 6,547,902 B2 | 4/2003 | Arai et al. | 156/64 |
| 6,708,862 B2 * | 3/2004 | Fujii et al. | 228/6.2 |
| 6,752,308 B2 * | 6/2004 | Mistry et al. | 228/49.1 |
| 2003/0001255 A1 | 1/2003 | Limura et al. | |

(Continued)

FOREIGN PATENT DOCUMENTS

JP            361251045 A        11/1986

(Continued)

*Primary Examiner*—Kiley Stoner
(74) *Attorney, Agent, or Firm*—Oliff & Berridge, PLC

(57) ABSTRACT

A die bonding apparatus for die bonding at least two members, which are heated in a heat treatment furnace, comprising a first member having a surface to be die bonded on which solder is disposed and a second member disposed to face the first member in a state in which the solder disposed on the surface of the first member to be die bonded is interposed therebetween, and a base portion for mounting the first member thereon in a predetermined position, wherein the base portion has a temperature distribution so that a temperature of a vicinity of a central portion in a predetermined direction of the base portion is higher than that of a vicinity of an end portion of the base portion in a state in which heating is effected in the heat treatment furnace to, so that it is possible to suppress the occurrence of bubbles in the solder.

3 Claims, 9 Drawing Sheets

U.S. PATENT DOCUMENTS

| | | | |
|---|---|---|---|
| 2003/0024963 A1* | 2/2003 | Fujii et al. | 228/44.7 |
| 2003/0226253 A1* | 12/2003 | Mayer | 29/832 |
| 2004/0129758 A1* | 7/2004 | Fujii et al. | 228/49.5 |
| 2005/0011768 A1* | 1/2005 | Stone et al. | 205/318 |

FOREIGN PATENT DOCUMENTS

| | | |
|---|---|---|
| JP | A-63-76461 | 4/1988 |
| JP | A-2-161736 | 6/1990 |
| JP | 2-187040 | 7/1990 |
| JP | A-2-187040 | 7/1990 |
| JP | A-5-283449 | 10/1993 |

\* cited by examiner

DIE BONDING APPARATUS

This is a Divisional of application Ser. No. 10/207,964 filed Jul. 31, 2002. The entire disclosure of the prior application is hereby incorporated by reference herein in its entirety.

BACKGROUND OF THE INVENTION

1. Field of the Invention

The present invention relates to a die bonding apparatus for die bonding, for example, a semiconductor chip to a substrate.

2. Description of the Related Art

In various electronic apparatuses, chips which are semiconductor devices are mounted as component parts. During the operation of a chip, the chip generates heat by being energized, and its temperature rises; however, there is a problem in that if the temperature of the chip rises excessively, its operation becomes unstable. To solve this problem, the chip is soldered, i.e., die bonded, to a substrate which also serves as a heat sink. The chip is die bonded to the substrate whereby the heat generated during the operation of the chip is radiated through the substrate. Therefore, the excessive temperature rise of the chip is suppressed, thereby maintaining the stable operation of the chip.

FIG. 11 is a cross-sectional view illustrating in a simplified form the state in which a chip 1 is die bonded to a substrate 2. The die bonding of the chip 1 with respect to the substrate 2 is generally effected as follows: Foil-like solder 3 is supplied to the surface of the substrate 2 to be die bonded, and the chip 1 is disposed on the side of the solder 3 which is opposite to a side of the solder 3 facing the substrate 2, such that the surface of the chip 1 to be die bonded is in contact with the solder 3. Namely, the chip 1, the solder 3, and the substrate 2 are arranged in that order such that the solder 3 is interposed between the chip 1 and the substrate 2. The chip 1 and the substrate 2 with the solder 3 interposed therebetween are loaded in, for example, a heat treatment furnace, and are heated to a temperature above the melting point of the solder 3. After the solder 3 melts and is filled in the gap between the chip 1 and the substrate 2, the chip 1, the substrate 2, and the solder 3 are cooled down to room temperature, thereby completing die bonding.

There are cases where bubbles 4 are produced in the solder 3 bonding the chip 1 and the substrate 2 owing to the entrainment of air or an atmospheric gas which is present in the heat treatment furnace or by an organic gas evaporating from the chip and the substrate which are die bonded. Since the portions of the bubbles 4 formed in the solder 3 are cavities, the thermal conductivity is extremely low in these portions as compared with the solder 4. The plurality of zigzag lines 5 in FIG. 11 schematically show the state in which the heat generated in the chip 1 during operation passes through the solder 3 and the substrate 2 and is radiated. The heat generated in the chip 1 is conducted toward the substrate 2, as indicated by the zigzag lines 5, but the heat is substantially not conducted at the portions of the bubbles 4 where the thermal conductivity is low. Accordingly, as for the heat generated in the chip 1, if the bubble 4 are present in the solder 3, the thermal conductivity declines appreciably at the portions of the bubbles 4, so that smooth heat conduction to the substrate 2 is hampered, and the temperature of the chip 1 rises undesirably.

In addition, if the bubbles 4 are present in the solder 3, the area of bonding between the chip 1 and the substrate 2 decreases, so that the bonding surface is subjected to thermal stresses occurring due to the repetition of the temperature rise and cooling during the operation and non-operation of the chip 1, thereby promoting the deterioration of the bonding surface. For this reason, it is necessary to suppress the occurrence of the bubbles 4 in the solder 3 at the time of die bonding the chip 1 and the substrate 2.

In the related art for suppressing the occurrence of bubbles in the solder at the time of die bonding, for instance, there is a method for controlling the temperature profile of the heat treatment furnace for melting and solidifying the solder. By controlling the temperature profile of the heat treatment furnace, a gas which causes the formation of bubbles is sufficiently removed from the solder during the melting and solidification of the solder, thereby suppressing the formation of the bubbles. However, with the method for controlling the temperature profile, there are problems in that it is impossible to obtain a noticeable effect in suppressing the occurrence of bubbles, that the temperature profile changes depending on the types of chips and substrates, and that time is required until the completion of die bonding, resulting in a decline in the efficiency.

In addition, as another example in the related art for suppressing the occurrence of bubbles, JP-A-5-283449, for example, discloses a technique wherein solder is remelted, and bubbles in the solder are removed by imparting ultrasonic vibrations to the solder at the time of remelting. In this related art, however, since the solder subjected once to die bonded is remelted, there is a problem in that the number of processes increases, resulting in a decline in the production efficiency. In addition, since a device for imparting ultrasonic vibrations is required, there is a problem in that the apparatus becomes large in size and complex.

Furthermore, as other examples of the related art for suppressing the occurrence of bubbles, JP-A-63-76461 and JP-A-2-161736, for example, disclose techniques wherein grooves or holes are formed in the substrate, and a gas which causes the occurrence of bubbles is allowed to escape through the grooves or holes formed in the substrate, so as to suppress the occurrence of the bubbles. In these examples of the related art, however, since the grooves or holes are formed in the substrate, there is a problem in that the strength of the substrate declines. In addition, since the substrate must be formed in advance, there is a problem in that the number of working processes increases, resulting in a decline in the production efficiency.

SUMMARY OF THE INVENTION

An object of the invention is to provide a die bonding apparatus, which is capable of suppressing the occurrence of bubbles in solder with a simple construction.

According to a first aspect of the invention, there is provided a die bonding apparatus for die bonding at least two members, which are heated in a heat treatment furnace, the apparatus including a first member having a surface to be die bonded on which solder is disposed, a base portion for mounting the first member thereon in a predetermined position, a second member disposed in an inclined manner with respect to the first member and facing the solder disposed on the surface of the first member to be die bonded, and an inclination attenuating member for inclining and holding the second member with respect to the first member, wherein the inclination attenuating member attenuates an angle of inclination of the second member with respect to the first member in a state in which the solder is melted.

In accordance with the invention, the arrangement provided is such that inclination attenuating member is included which, in a state in which the solder is in an unmolten state, holds the second member by inclining it with respect to the first member, and which, in a state in which the solder is in a molten state, attenuates the angle of inclination of the second member with respect to the first member so as to die bond the second member and the first member. Consequently, the molten solder is filled between the first member and the second member while being consecutively pressurized by the second member from one end portion toward the other end portion of the solder. Accordingly, since the gas which causes the occurrence of bubbles is removed from the molten solder, it is possible to form a sound soldered portion in which bubbles are few.

According to a second aspect of the invention, the inclination attenuating member is a thermally fusing member having a melting point exceeding a melting point of the solder.

According to a third aspect of the invention, the thermally fusing member is another solder.

In accordance with the invention, the inclination attenuating member is formed by a thermally fusing member, e.g., another piece of solder, which melts upon being heated to a temperature exceeding the melting point of the solder. Since the thermally fusing member is a solid at a temperature below the melting point of the solder, the thermally fusing member is capable of holding the second member in an inclined manner with respect to the first member. Upon being heated to a temperature exceeding the melting point of the solder, the thermally fusing member gradually melts and its shape changes, so that the thermally fusing member is capable of attenuating the angle of inclination of the second member with respect to the first member. Thus the inclination attenuating member can be realized with such a simple construction in which the thermally fusing member is provided, and it is possible to form a sound soldered portion in which bubbles are few.

In addition, since a desired melting point can be obtained for the solder by adjusting its chemical composition, the melting points of the solder and another piece of solder serving as the inclination attenuating member can be respectively set to desired temperatures. Consequently, when heating is effected to a temperature exceeding the melting point of the solder, the other piece of solder can be melted, thereby making it possible to reliably exhibit the function of attenuating the angle of inclination of the second member with respect to the first member.

According to a fourth aspect of the invention the inclination attenuating member is a heat-shrinkable member, which shrinks in a state in which the heat-shrinkable member is heated to a temperature exceeding a melting point of the solder.

According to a fifth aspect of the invention, the inclination attenuating member is a heat-sublimating member, which sublimates in a state in which the heat-sublimating member is heated to a temperature exceeding a melting point of the solder.

In accordance with the invention, the inclination attenuating member is formed by a heat-shrinkable member or a heat-sublimating member. Since, at a temperature below the melting point of the solder, the heat-shrinkable member and the heat-sublimating member are solids and their initial shapes are maintained, the heat-shrinkable member and the heat-sublimating member are capable of holding the second member in an inclined manner with respect to the first member. Upon being heated to a temperature exceeding the melting point of the solder, the heat-shrinkable member undergoes thermal shrinkage and its volume is reduced, while the heat-sublimating member vaporizes and its volume is reduced, so that the angle of inclination $\square 1$ of the second member with respect to the first member can be gradually attenuated. Thus the attenuation of the angle of inclination of the second member with respect to the first member can be realized with such a simple construction in which the heat-shrinkable member or the heat-sublimating member is provided, and it is possible to form a sound soldered portion in which bubbles are few.

According to a sixth aspect of the invention the inclination attenuating member includes a supporting member one end portions of which abuts against the second member to support the second member and a driving member for driving the supporting member in a direction in which the one end portion of the supporting member abutting against the second member approaches the base portion in the state in which the solder is melted.

In accordance with the invention, the inclination attenuating member includes a supporting member for supporting the second member and driving member for driving the supporting member in a direction in which the supporting member approaches the base portion. Since the angle of inclination of the second member with respect to the first member is thus attenuated by the mechanical arrangement, it is possible to use the identical inclination attenuating member repeatedly, and the reproduction of operation can be ensured positively.

According to a seventh aspect of the invention, the inclination attenuating member includes a spring member provided on the base portion to support the second member and a compressing member for compressing the spring member in a direction in which one end portion of the spring member supporting the second member approaches the base portion in the state in which the solder is melted.

In accordance with the invention, the inclination attenuating member includes a spring member for supporting the second member and compressing member for compressing the spring member. Since the angle of inclination of the second member with respect to the first member is thus attenuated by the spring member and the compressing member, it is possible to use the identical inclination attenuating member repeatedly, and the reproduction of operation can be ensured positively.

According to an eighth aspect of the invention, there is provided a die bonding apparatus for die bonding at least two members, which are heated in a heat treatment furnace, the apparatus having a first member having a surface to be die bonded on which solder is disposed, a base portion for mounting the first member thereon in a predetermined position, a second member disposed in an inclined manner with respect to the first member and facing the solder disposed on the surface of the first member to be die bonded, and a magnetically attracting member for attracting the second member by a magnetic force.

In accordance with the invention, magnetically attracting member is provided for attracting the second member by a magnetic force. In the state in which the solder is melted, the angle of inclination of the second member with respect to the first member can be attenuated by the magnetic force of the magnetically attracting member. Thus the magnetically attracting member can be used repeatedly for the attenuation of the angle of inclination of the second member, and the reproduction of operation can be ensured reliably.

According to a ninth aspect of the invention, there is provided a die bonding apparatus for die bonding at least two members, which are heated in a heat treatment furnace, the apparatus having a first member having a surface to be die bonded on which solder is disposed, a base portion for mounting the first member thereon in a predetermined position, a second member disposed in an inclined manner with respect to the first member and facing the solder disposed on the surface of the first member to be die bonded, a pushing-up member one end portion of which abuts against a side of the first member, which is opposite to a side thereof where the solder is disposed, and a pushing-up driving member for driving the pushing-up member in a direction in which the one end portion abutting against the first member moves away from the base portion in a state in which the solder is melted.

In accordance with the invention, the die bonding apparatus includes a pushing-up member whose one end portion abuts against the first member and pushing-up driving member for driving the pushing-up member in a direction in which the pushing-up member moves away from the base portion, and the pushing-up member driven by the pushing-up driving member moves the first member toward the second member to die bond the first member and the second member. Since the first member is moved toward the second member with such a mechanical arrangement, the pushing-up member and the pushing-up driving member can be used repeatedly, and the reproduction of operation can be ensured reliably.

According to a tenth aspect of the invention, there is provided a die bonding apparatus for die bonding at least two members, which are heated in a heat treatment furnace, the apparatus having a first member having a surface to be die bonded, a second member facing the surface of the first member to be die bonded, having solder on a surface thereof facing the first member, and disposed in such a manner as to be inclined with respect to the first member, and a base portion for mounting the first member thereon in a predetermined position, wherein the base portions is formed an inclination holding portion thereon so as to abut against the second member and hold a state of inclination of the second member with respect to the first member.

In accordance with the invention, on the base portion for mounting the first member thereon in a predetermined position, an inclination holding portion is formed so as to abut against the second member and hold the state of inclination of the second member with respect to the first member. Thus the holding of the inclination of the second member with respect to the first member with such a simple construction in which the inclination holding portion is formed on the base portion. By making use of the wettability and surface tension of the solder which is provided on the surface of the second member to be die bonded and which is in a molten state upon heating, the first member is gradually attracted toward the second member side, thereby making it possible to remove from the solder the gas which causes the occurrence of bubbles. Hence, it is possible to form a sound soldered portion in which bubbles are few.

According to an eleventh aspect of the invention, a die bonding apparatus for die bonding at least two members, which are heated in a heat treatment furnace, the apparatus having a first member having a surface to be die bonded on which solder is disposed, a second member disposed to face the first member in a state in which the solder disposed on the surface of the first member to be die bonded is interposed therebetween, a base portion for mounting the first member thereon in a predetermined position, wherein the base portion has a temperature distribution so that a temperature of a vicinity of a central portion in a predetermined direction of the base portion is higher than that of a vicinity of an end portion of the base portion in a state in which heating is effected in the heat treatment furnace.

In accordance with the invention, in the base portion for mounting the first member thereon in a predetermined position, a temperature distribution is formed such that the temperature of a vicinity of a central portion in a predetermined direction of the base portion becomes higher than the temperature of a vicinity of an end portion of the base portion in a state in which heating is effected in the heat treatment furnace.

Consequently, since the solder disposed on the surface of the first member to be die bonded consecutively melts, starting from a portion corresponding to the central portion of the base portion where the temperature is high toward a portion corresponding to an end portion of the base portion where the temperature is low. Therefore, the gas which causes the occurrence of bubbles is removed in the consecutively melting process, so that a sound soldered portion in which bubbles are few is formed.

According to a twelfth aspect of the invention, the base portion is formed so that the thickness of the vicinity of the central portion in the predetermined direction is smaller than that of the vicinity of the end portion.

In accordance with the invention, the base portion is formed such that the thickness of the vicinity of the central portion in the predetermined direction is smaller than the thickness of the vicinity of the end portion. Accordingly, since the quantity of heat in the central portion of the base portion becomes smaller than the quantity of heat in the end portion thereof, the temperature of the central portion rises earlier than that of the end portion. By virtue of such a simple construction in which the thickness of the central portion of the base portion is made smaller than the thickness of the end portion thereof, it is possible to realize a temperature distribution for setting the temperature of the central portion of the base portion higher than that of the end portion thereof.

According to a thirteenth aspect of the invention, a heat conducting member having a thermal conductivity exceeding the thermal conductivity of the base portion is provided on an outer side of the base portion in contact with the base portion.

In accordance with the invention, a heat conducting member having a thermal conductivity higher than the thermal conductivity of the base portion is provided in contact with the base portion. Since the quantity of heat transmitted to the base portion through the heat conducting member and thereby dissipated is small in the central portion of the base portion and is large in the end portion thereof, the temperature of the central portion rises earlier than that of the end portions in accordance with the heat balance. By virtue of such a simple construction in which the heat conducting member is provided which is in contact with the base portion and has a thermal conductivity higher than that of the base portion, it is possible to realize a temperature distribution for setting the temperature of the central portion of the base portion higher than that of the end portion thereof.

DETAILED DESCRIPTION OF THE PREFERRED EMBODIMENTS

Figure 1:
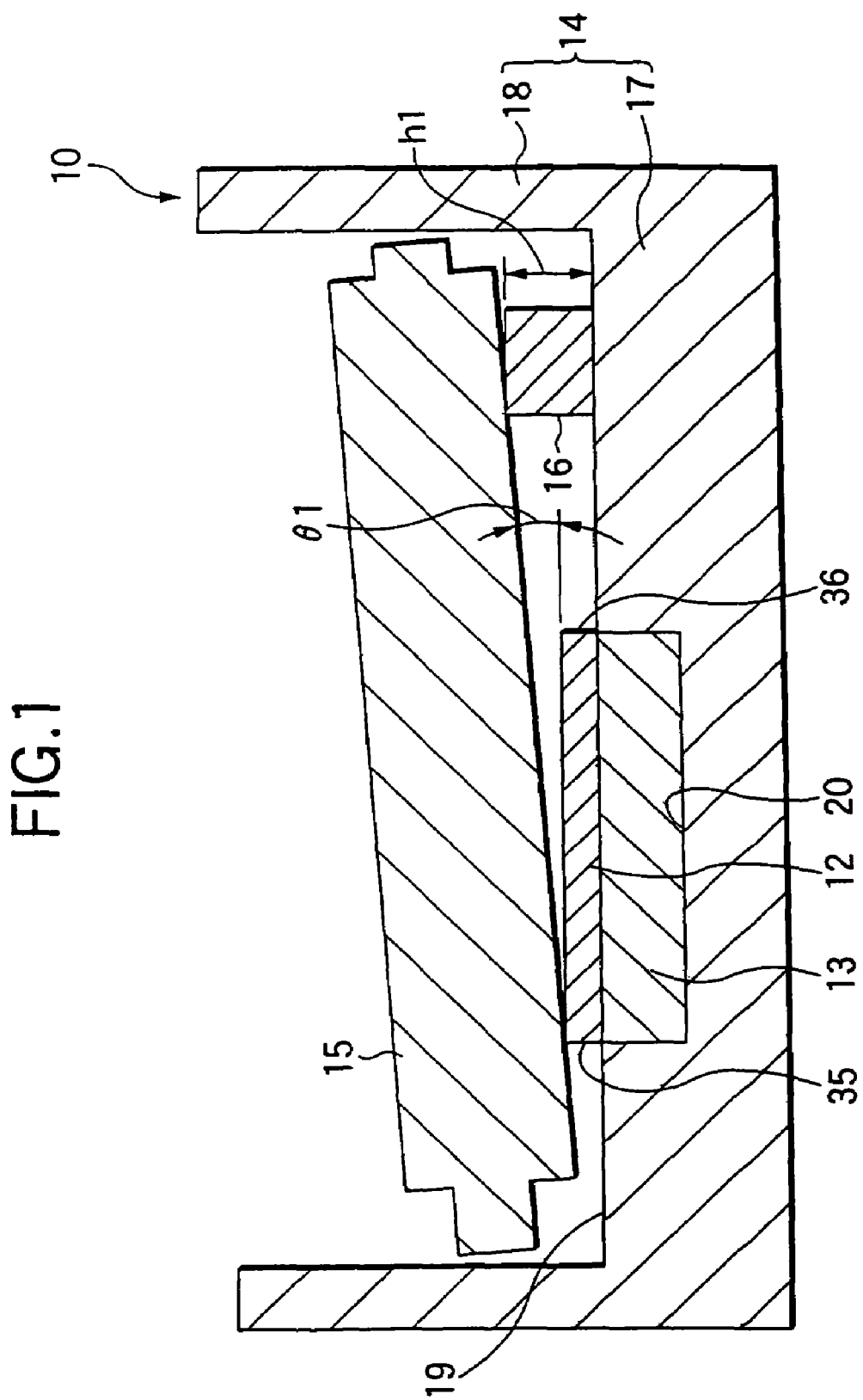
FIG. 1 is a schematic cross-sectional view illustrating in a simplified the construction of a die bonding apparatus 10 in accordance with an embodiment of the invention.
Figure 2A:
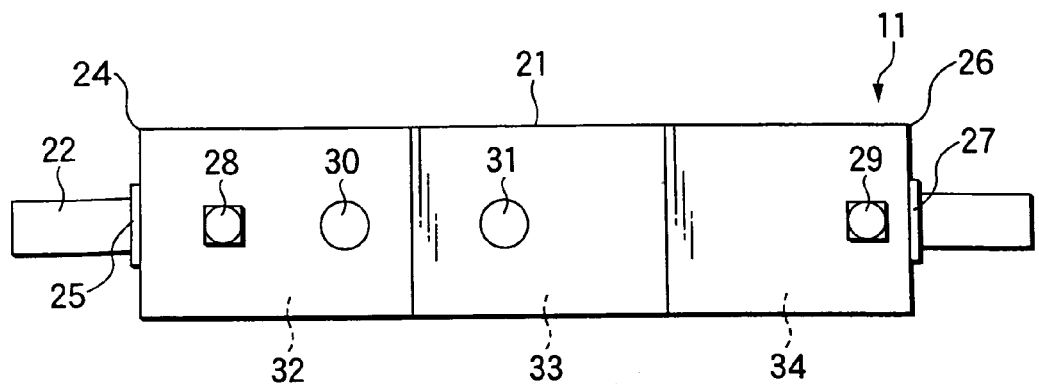
FIGS. 2A and 2B are external views of a heat treatment furnace 11 in which the die bonding apparatus 10 shown in FIG. 1 is loaded and is heated.
Figure 2B:
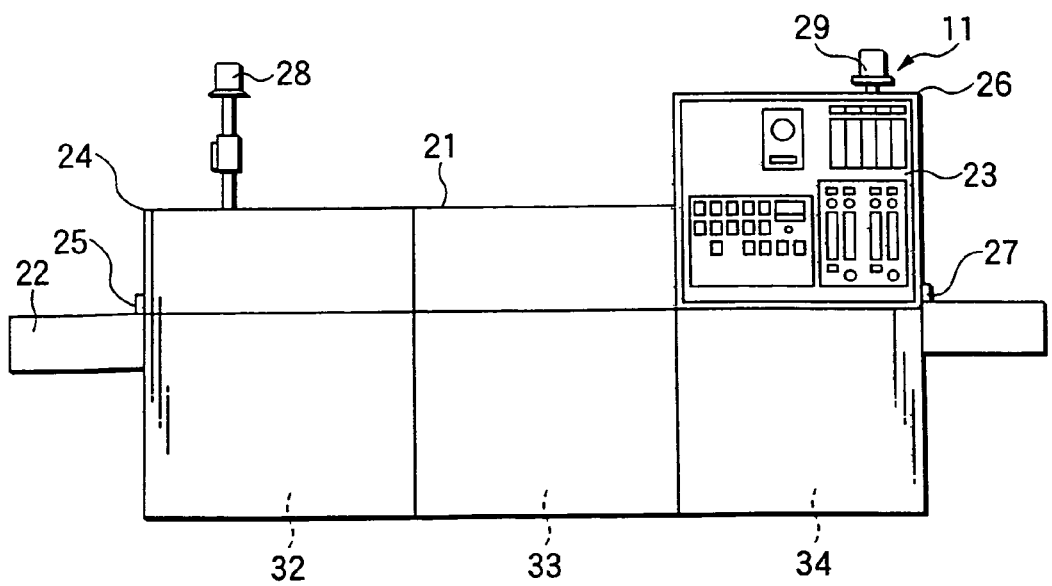

FIG. 1 is a schematic cross-sectional view simply illustrating the construction of a die bonding apparatus 10 in accordance with an embodiment of the invention. FIGS. 2A and 2B are external views of a heat treatment furnace 11 in which the die bonding apparatus 10 shown in FIG. 1 is loaded and is heated.

The die bonding apparatus 10 includes a first member 13, a base portion 14, a second member 15, and an inclination attenuating member 16. The first member 13 having a surface to be die bonded on which solder 12 is disposed. The base portion 14 for mounting the first member 13 thereon in a predetermined position. The second member 15 which is disposed in an inclined manner with respect to the first member 13 and faces the solder 12 disposed on the surface of the first member 13 to be die bonded. The inclination attenuating member 16 for inclining and holding the second member 15 with respect to the first member 13 so as to attenuate the angle of inclination □1 of the second member 15 with respect to the first member 13 in a state in which the solder 12 is melted.

The first member 13 is a chip constituted by a semiconductor device (hereafter, the first member 13 will be referred to as the chip), and is formed substantially in the shape of a rectangular parallelepiped. The second member 15 is a substrate (hereafter, the second member 15 will be referred to as the substrate), and is partially provided with copper plating on a flat plate made of an iron alloy. It should be noted that the material of the substrate 15 is not limited to the iron alloy, and copper, molybdenum, or the like may be used. As the solder 12, foil-like solder, for example, has a composition of 50% tin and the remaining thereof is lead, that is, the solder 12 includes composition of substantially 50% lead and 50% tin. The solder 12 has 215° C. in melting point and 100 µm in thickness.

The base portion 14 is a so-called tray which is formed of carbon as its material and includes a base body 17 formed substantially in the shape of a rectangular parallelepiped and a pair of side plates 18 rising vertically upward from the base body 17 at peripheral edge portions of the base body 17. In a surface 19 (hereafter referred to as the base-body upper surface 19) on a side where the side plats rise up, a first recess portion 20 capable of accommodating the chip is formed at a position which is predetermined by the relative relationship between the chip 13 and the substrate 15 which are die bonded.

The chip 13 is mounted so as to be accommodated in the recess portion 20 of the base portion 14, and the foil-like solder 12 is disposed on the surface of the chip 13 to be die bonded. The substrate 15 is disposed on a side of the solder 12, which is opposite to a side of the solder 12 facing the substrate 13. The substrate 15 is supported by the solder 12 disposed on the chip and by the inclination attenuating member 16 disposed on the base-body upper surface 19. At this time, the substrate 15 is disposed in an inclined state so as to have the angle of inclination θ1 with respect to the solder 12 disposed on the chip 13.

In this embodiment, the inclination attenuating member 16 is another piece of solder. The other solder 16 has a composition of 10% tin and the remaining thereof is lead, that is, the other solder 16 has a composition of about 90% lead and 10% tin. The other solder 16 has 299° C. in melting point. Thus the other solder 16 has a characteristic that melting point thereof is higher than that of the aforementioned solder 12 by 84° C. Further, the other solder 16 has a characteristic in its dimensions, particularly its height h1. The height h1 of the other solder 16 is selected such that the angle of inclination of the substrate 15, which is disposed in such a manner as to face the solder 12 disposed on the chip 13, with respect to the solder 12 and, hence, the chip 13 becomes □1. This arrangement realizes a state in which the substrate 15 is held so as to be inclined with respect to the chip 12.

The chip 13, the solder 12, the substrate 15, and the other solder 16, which are disposed on the base portion 14 as described above, are loaded into and heated in the heat treatment furnace 11, so that the solder 12 is melted to die bond the chip 13 and the substrate 15.

Returning to FIGS. 2A and 2B, a description will be given of an outline of the heat treatment furnace 11. FIG. 2A shows a plan view of the heat treatment furnace 11, and FIG. 2B shows a front elevational view of the heat treatment furnace 11. The heat treatment furnace 11 is a reflow furnace and has a furnace body 21, a conveying member 22, and a control unit 23. The furnace body 21 is a hollow container formed substantially in the shape of a rectangular parallelepiped, and a heating zone formed by heating elements such as elema elements is provided in its interior. A loading port 25 for loading into the furnace body 21 the base portion 14 on which the chip 13, the substrate 15, and the like are disposed is formed at one end portion 24 of the furnace body 21. A discharge port 27 for discharging the base portion 14 is formed at the other end portion 26 of the furnace body 21. The heating zone is substantially divided into first to third zones 32, 33, and 34, which are provided in the furnace body 21 in that order from the loading port 25 toward the discharge port 27.

The interior of the furnace body 21 is kept in an atmosphere of mixed gas including nitrogen and hydrogen so as to prevent the oxidation of the chip 13 and the substrate 15, which are die bonded, and the solder 12. Nitrogen gas curtains are provided at the loading port 25 and the discharge port 27 on the inner sides of the furnace body 21 so as to prevent the entry of the atmospheric air into the furnace body 21 when the base portion 14 is loaded and discharged. Since the hydrogen gas is used in the atmospheric gas in the furnace body 21, and first and second burn offs 28 and 29, which are safety valves, are provided for the furnace body 21. In addition, first and second exhaust ports 30 and 31 are formed in the furnace body 21, and the arrangement provided is such that the atmospheric gas in the furnace body 21 can be forcibly exhausted by fans.

The conveying member 22 consists of a conveyor, and is provided in such a manner as to extend through the furnace body 21 in its longitudinal direction. The base portion 14, which is loaded through the loading port 25 and on which the chip 13, the substrate 15, and the like are disposed, is carried on the conveying member 22, is passed through the heating zone provided in the furnace body 21, and is conveyed to the discharge port 27.

The control unit 23 is juxtaposed to the furnace body 21 in the vicinity of the other end portion 26 of the furnace body 21. The control unit 23 is provided with a control panel and circuits for controlling such as the furnace temperature, temperature rise and temperature fall profiles of the heating zone, and the conveying speed of the conveying member 22. An operator controls the conditions of die bonding through the control panel.

A description will be given of the operation in which the base portion 14, on which the chip 13, the substrate 15, the solder 12, and the other solder 16 are disposed as described above, is heated by the heat treatment furnace 11 to die bond the chip 13 and the substrate 15.

The temperature of the heating zone provided in the furnace body 21 is set as follows: The temperature of the first zone 32 close to the loading port 25 is set to a temperature just above the melting point of the solder 12, e.g., 235° C. The temperature of the third zone 34 close to the discharge port 27 is set to a temperature lower than the melting point of the solder 12, e.g., 25° C. The temperature of the second zone 33 which is the central portion is set to a temperature higher than the melting point of the other solder 16, e.g., 320° C.

The base portion 14, on which the chip 13, the solder 12, the substrate 15, and the other solder 16 are disposed, is loaded into the furnace body 21 through the loading port 25, and is conveyed through the heating zone provided in the furnace body 21 by the conveying member 22. First, when heating is effected in the first zone 32 up to a temperature above the melting point of the solder 12, the solder 12 disposed on the chip 13 melts. When the base portion 14 is further conveyed to the second zone 33 whose set temperature is higher, heating is effected to a temperature above the melting point of the other solder 16, the other solder 16 begins to melt.

Although the other solder 16 in the solid state holds the substrate 15 such that the substrate 15 is inclined with respect to the chip 13, its height h1 gradually decreases as melting proceeds, so that the angle of inclination □1 of the substrate 15 with respect to the solder 12 gradually attenuates. The solder 12 which is melted at this time is filled between the chip 13 and the substrate 15 while being consecutively pressed by the substrate 15 from one end portion 35 toward the other end portion 36 of the solder 12, so that the gas which causes the occurrence of bubbles is removed from the molten solder 12, and a sound soldered portion in which bubbles are few is formed. It should be noted that the attenuation of the angle of inclination □1 of the substrate 15 with respect to the chip 13 stops when the other solder 16 has undergone melting and the substrate 15 and the chip 13 have become parallel, i.e., when the angle of inclination □1 has become zero.

When the base portion 14 on which the chip 13, the solder 12, the substrate 15, and the like are disposed is conveyed to the third zone 34, since the set temperature of the third zone 34 is lower than the melting point of the solder 12, the solder 12 which was melted between the chip 13 and the substrate 15 solidifies. The base portion 14 on which the chip 13, the solder 12, the substrate 15, and the like are disposed is further conveyed from the discharge port 27 to outside the furnace body 21, thereby completing the die bonding between the chip 13 and the substrate 15.

Although in this embodiment the inclination attenuating member 16 is the other solder, the inclination attenuating member 16 may be a heat-shrinkable member or a heat-sublimating member instead of the other solder 16. The heat-shrinkable member can be realized by such as a copolymer (PFA) of tetrafluoroethylene and perfluoroalkyl vinylether, which is a fluorocarbon resin, or polytetrafluoroethylene (PTFE). Upon being heated to a temperature higher than the melting point of the solder 12, the heat-shrinkable member undergoes thermal shrinkage and its volume is reduced, while the heat-sublimating member vaporizes and its volume is reduced, so that the angle of inclination □1 of the substrate 15 with respect to the chip 13 can be gradually attenuated.

Figure 3:
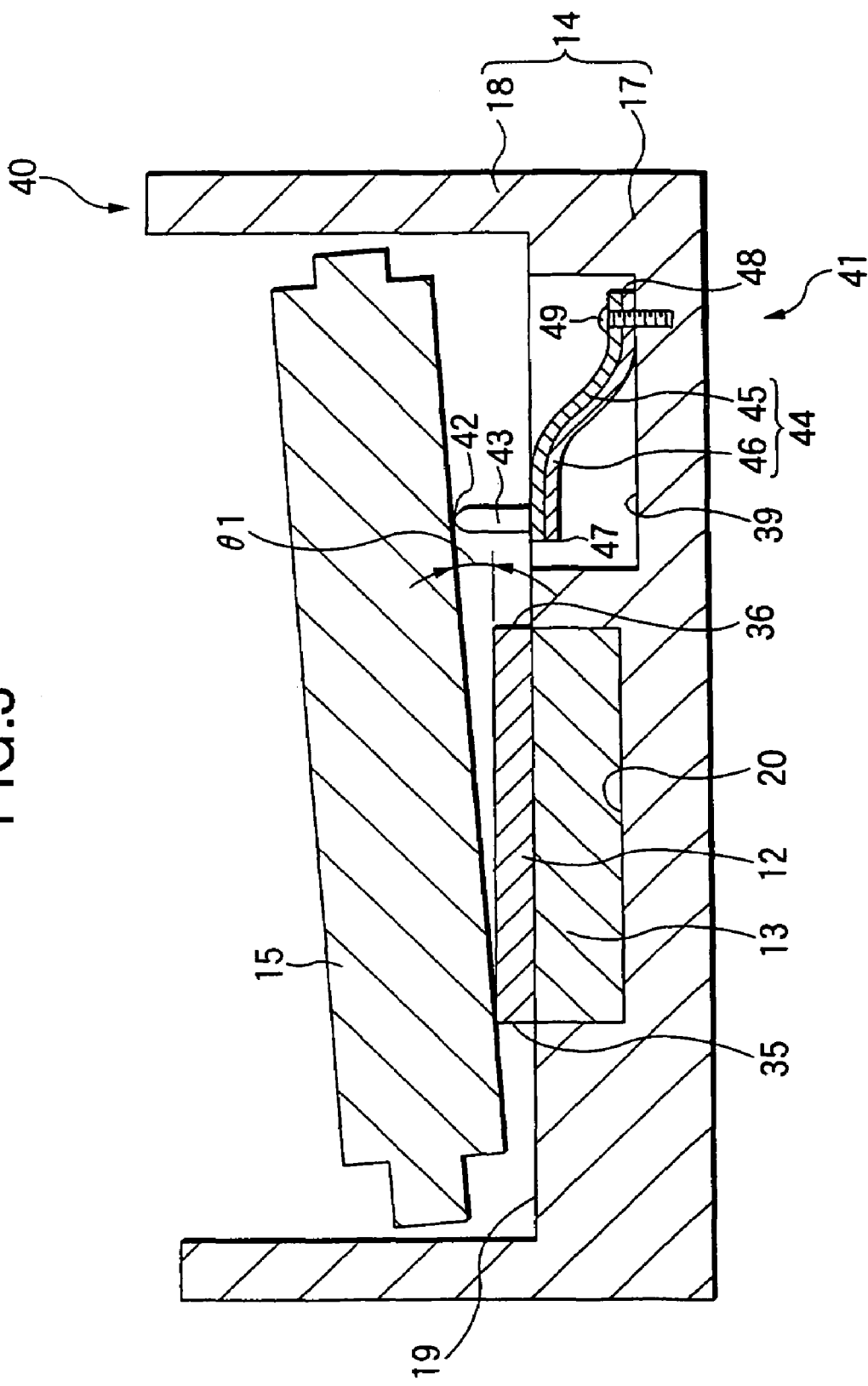
FIG. 3 is a schematic cross-sectional view illustrating in a simplified form the configuration of a die bonding apparatus 40 in accordance with a second embodiment of the invention.

FIG. 3 is a schematic cross-sectional view illustrating in a simplified form the configuration of a die bonding apparatus 40 in accordance with a second embodiment of the invention. The die bonding apparatus 40 in this embodiment is similar to the die bonding apparatus 10 in accordance with the first embodiment, so that corresponding parts will be denoted by the same reference numerals, and a description thereof will be omitted. An inclination attenuating member 41 in this embodiment includes a supporting member 43 for supporting the substrate 15 as one end portion 42 of the supporting member 43 abuts against the substrate 15 and a driving member 44 for driving the supporting member 43 in a direction in which the one end portion 42 of the supporting member 43 abutting against the substrate 15 approaches the base portion 14 in the state in which the solder 12 is melted.

The supporting member 43 is a metallic rod-shaped member whose one end portion 42 is formed in a semispherical shape, and whose other end portion located away from the one end portion 42 is secured to the driving member 44. The driving member 44 is a bimetal in which a high expansion alloy 45 having a large thermal expansion coefficient and a low expansion alloy 46 whose thermal expansion coefficient is smaller than that of the high expansion alloy 45 are laminated. The bimetal 44 is formed in such a manner as to be curved so as to have a curvature on the low expansion alloy 46 side. The aforementioned supporting member 43 is secured to the high expansion alloy 45 side in the vicinity of one end portion 47 of the bimetal 44. The bimetal 44 is disposed in a second recess portion 39 formed in the base body 17, such that its side having the curvature faces the base body 17. The other end portion 48 of the bimetal 44 is fixed to the base body 17 by means of a threaded member 49.

When heating is effected in the heat treatment furnace 11, since the thermal expansion coefficient of the high expansion alloy 45 is larger than that of the low expansion alloy 46, the bimetal 44 is deformed such that its curvature becomes small, so that the supporting member 43 is driven in the direction in which it approaches the base body 17. If the thermal expansion coefficients of the high expansion alloy 45 and the low expansion alloy 46 are respectively set so that the one end portion 42 of the supporting member 43 is able to move to a position lower than the surface of the solder 12 facing the substrate 15 in the state in which heating is effected to a temperature exceeding the melting point of the solder 12 and the solder 12 is melted, it is possible to attenuate the angle of inclination □1 of the substrate 15 with respect to the chip 13 in the state in which the solder 12 is melted. Since the angle of inclination □1 of the substrate 15 with respect to the chip 13 is thus attenuated by the mechanical arrangement, it is possible to use the identical inclination attenuating member 41 repeatedly, and the reproduction of operation can be ensured positively.

Figure 4:
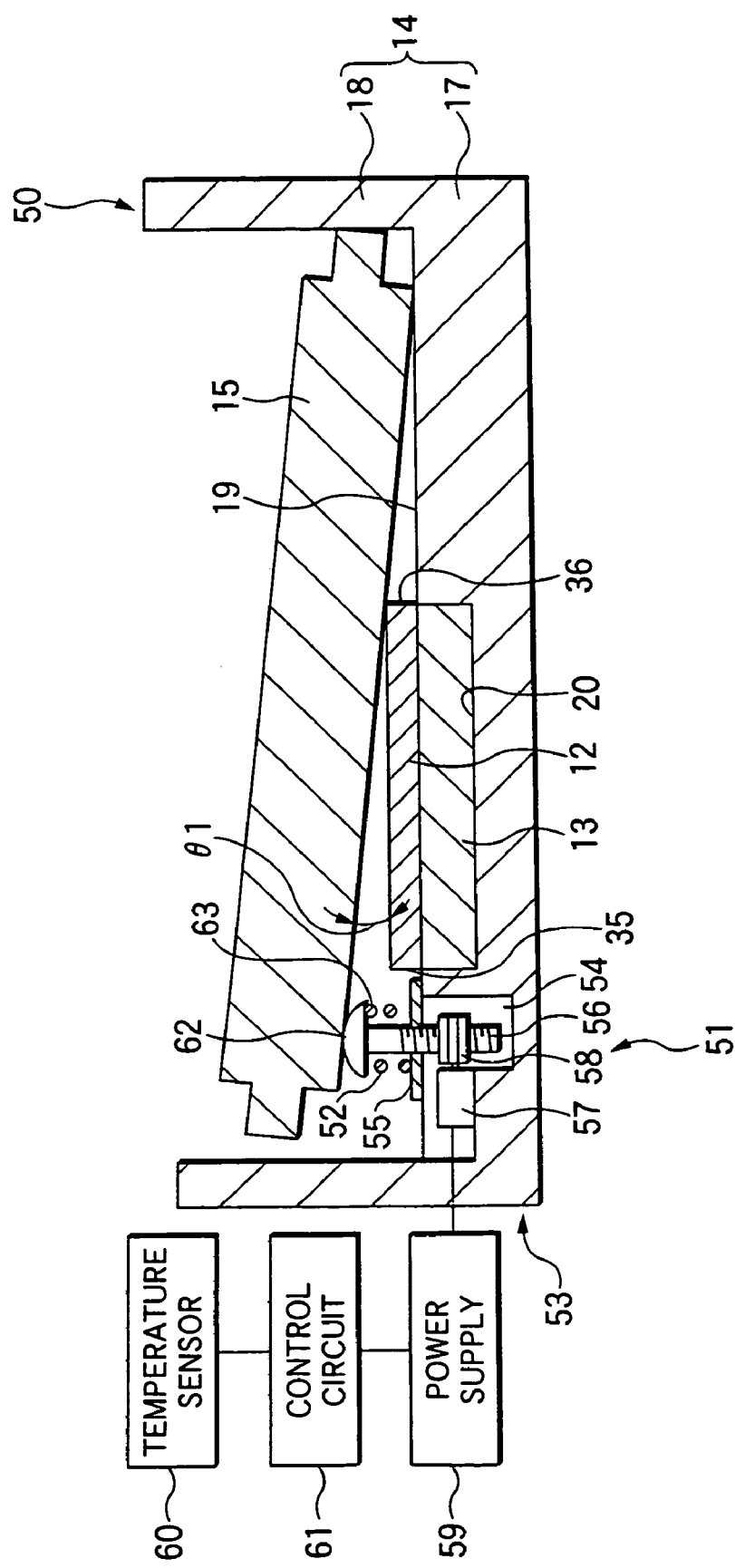
FIG. 4 is a schematic cross-sectional view illustrating in a simplified form the configuration of a die bonding apparatus 50 in accordance with a third embodiment of the invention.

FIG. 4 is a schematic cross-sectional view simply illustrating the configuration of a die bonding apparatus 50 in accordance with a third embodiment of the invention. The die bonding apparatus 50 in this embodiment is similar to the die bonding apparatus 10 in accordance with the first embodiment, so that corresponding parts will be denoted by the same reference numerals, and a description thereof will be omitted. An inclination attenuating member 51 in this embodiment includes a spring member 52 provided on the base portion 14 to support the substrate 15 and a compressing member 53 for compressing the spring member 52 in a direction in which one end portion 63 of the spring member 52 supporting the substrate 15 approaches the base portion 14 in the state in which the solder 12 is melted.

The spring member 52 is a metallic coil spring and is provided on a holding plate 55 provided on the base-body upper surface 19 in such a manner as to have its axis in a direction perpendicular to the base-body upper surface 19, so as to support the substrate 15. The compressing member 53 includes a rack member 56, a micromotor 57, a spur gear 58 fitted on an output shaft of the micromotor 57, a power supply 59 for supplying electric power to the micromotor 57, a temperature sensor 60, and a control circuit 61.

The rack member 56 is made of a metal and is a substantially rod-shaped member having one end portion on which a semispherical shape supporting piece 62 is formed and having the other end on which a rack is formed. The rack member 56 is passed through the inner side of the coil-like spring member 52. The one end portion thereof at the supporting piece 62 is held by the spring member 56. The other end portion thereof where the rack is formed is located in a third recess portion 54 formed in the base body 17. It should be noted that the supporting piece 62 abuts against the substrate 15 and, together with the spring member 56, supports the substrate 15 such that the substrate 15 is inclined with respect to the chip 13.

The micromotor 57 is provided in the third recess portion 54 where the other end portion of the rack member 56 is located. The spur gear 58 fitted on the output shaft of the micromotor 57 and the rack formed in the vicinity of the other end portion of the rack member 56 are provided in such a manner as to mesh with each other, whereby the rotatively driving force of the micromotor 57 is converted to linear motion of the rack member 56.

The temperature sensor 60 is a thermometer which is realized by, for example, a thermocouple, and is fitted on the base portion 14 to detect the temperature at the time of heat treatment. The detected output of the temperature sensor 60 is inputted to the control circuit 61. When the temperature of the base portion 14 has reached the melting point of the solder 12, the control circuit 61 outputs to the power supply 59 an instruction for supplying electric power to the micromotor 57 in response to the detected output of the temperature sensor 60. Since the power supply 59 starts the supply of electric power to the micromotor 57 in response to the output of the control circuit 61, the spur gear 58 is rotatively driven, which in turn causes the rack member 56 to move downward as viewed in FIG. 4. Due to the movement of the rack member 56, the spring member 52 is compressed in a direction in which the one end portion 63 of the spring member 52 supporting the substrate 15 is pressed by the supporting piece 62, and approaches the base body 17. Thus it is possible to attenuate the angle of inclination □1 of the substrate 15 with respect to the chip 13 in the state in which the solder 12 is melted. Here, the control circuit 61 and the power supply 59 may be provided in the control unit 23 of the heat treatment furnace 11, or may be provided as a separate device from the heat treatment furnace 11.

In this embodiment, the arrangement provided is such that the driving of the micromotor 57 is controlled by the provision of the temperature sensor 60. However, an arrangement may be provided such that, instead of the temperature sensor 60, a timer is provided, and the driving of the micromotor 57 is controlled on the basis of the time elapsed after the chip 13, the solder 12, the substrate 15, and the like were loaded into the furnace body 21 through the loading port 25.

Figure 5:
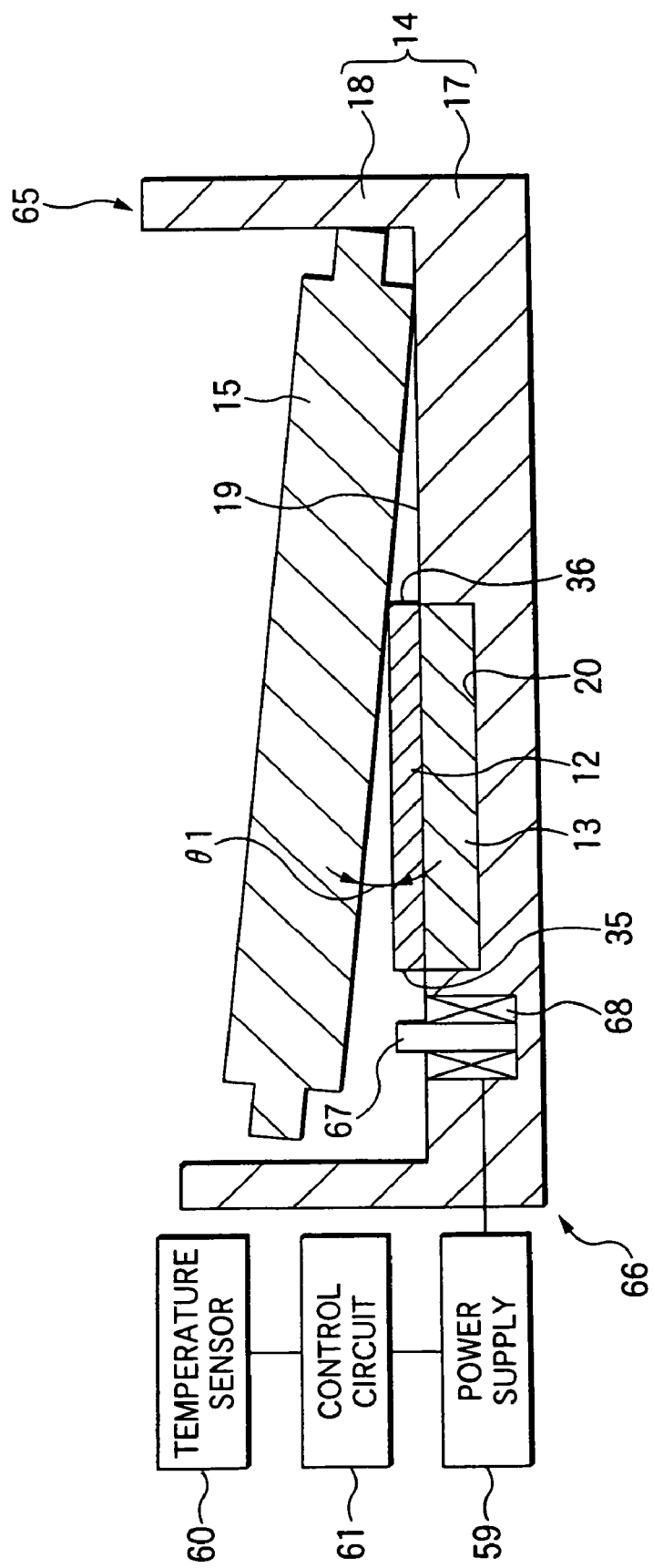
FIG. 5 is a schematic cross-sectional view illustrating in a simplified form the configuration of a die bonding apparatus 65 in accordance with a fourth embodiment of the invention.

FIG. 5 is a schematic cross-sectional view simply illustrating the configuration of a die bonding apparatus 65 in accordance with a fourth embodiment of the invention. The die bonding apparatus 65 in this embodiment is similar to the die bonding apparatus 50 in accordance with the third embodiment, so that corresponding parts will be denoted by the same reference numerals, and a description thereof will be omitted. A point to be noted is that the die bonding apparatus 65 in this embodiment has a magnetically attracting member 66 for attracting the substrate 15 by a magnetic force. The magnetically attracting member 66 has a core member 67, an exciting coil 68 disposed on the outer side of the core member 67, the power supply 59 for supplying electric power to the exciting coil 68, the temperature sensor 60, and the control circuit 61.

The core member 67 has a cylindrical shape, and is formed of a ferromagnetic material such as ferrite. On the radially outward side of the core member 67, the exciting coil 68 is formed by winding a conductor around the axis of the core member 67. The core member 67 and the exciting coil 68 are provided on the base body 17 in such a manner as to have its axis in a direction perpendicular to the base-body upper surface 19.

In the same way as the above-described third embodiment, the temperature sensor 60 is a thermometer which is realized by, for example, a thermocouple, and is fitted on the base portion 14 to detect the temperature at the time of heat treatment. The detected output of the temperature sensor 60 is inputted to the control circuit 61. When the temperature of the base portion 14 has reached the melting point of the solder 12, the control circuit 61 outputs to the power supply 59 an instruction for energizing the exciting coil 68 in response to the detected output of the temperature sensor 60. Since the power supply 59 starts the energization of the exciting coil 68 in response to the output of the control circuit 61, the core member 67 excited by the exciting coil 68 becomes an electromagnet, and attracts the substrate 15 by means of a magnetic force. Thus it is possible to attenuate the angle of inclination □1 of the substrate 15 with respect to the chip 13 in the state in which the solder 12 is melted.

Although, in this embodiment, the holding of the inclination of the substrate 15 with respect to the chip 13 relies on the frictional force between the substrate 15 and the side plate 18 of the base portion 14 against which one end of the substrate 15 abuts, the inclination may be held by disposing between the substrate 15 and the base-body upper surface 19 a spring member or the like which can be easily compressed by the magnetically attracting force of the electromagnet.

Figure 6:
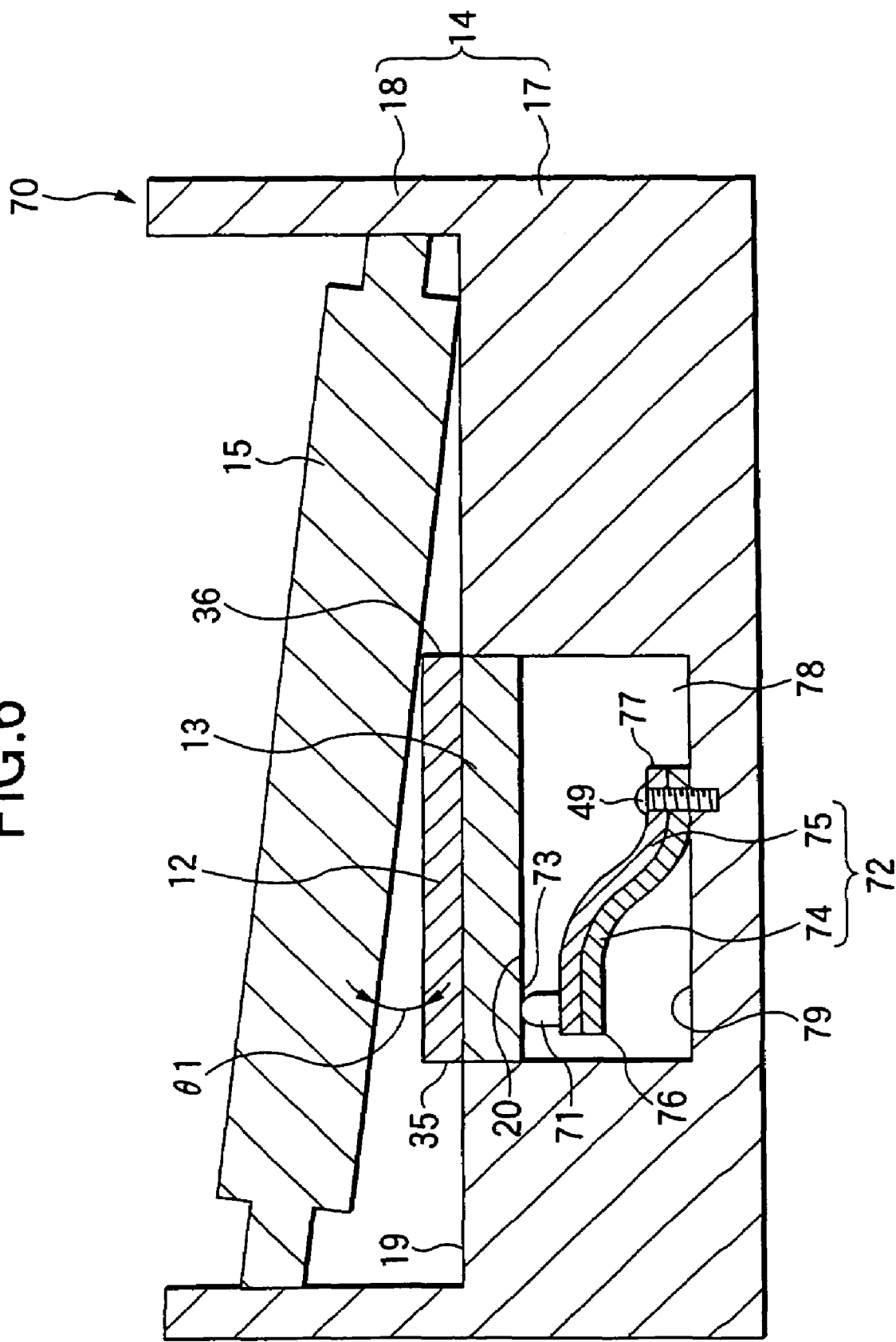
FIG. 6 is a schematic cross-sectional view illustrating in a simplified form the configuration of a die bonding apparatus 70 in accordance with a fifth embodiment of the invention.

FIG. 6 is a schematic cross-sectional view simply illustrating the configuration of a die bonding apparatus 70 in accordance with a fifth embodiment of the invention. The die bonding apparatus 70 in this embodiment is similar to the die bonding apparatus 40 in accordance with the second embodiment, so that corresponding parts will be denoted by the same reference numerals, and a description thereof will be omitted. A point to be noted is that the die bonding apparatus 70 in this embodiment includes a pushing-up member 71 whose one end portion 73 abuts against the side of the chip 13 which is opposite to its side where the solder 12 is disposed and a pushing-up driving member 72 for driving the pushing-up member 71 in a direction in which the one end portion 73 abutting against the chip 13 moves away from the base portion 14 in the state in which the solder 12 is melted.

The pushing-up member 71 is a metallic rod-shaped member whose one end portion 73 is formed in a semi-spherical shape, and whose other end portion located away from the one end portion 73 is secured to the pushing-up driving member 72. The pushing-up driving member 72 is a bimetal in which a high expansion alloy 74 having a large thermal expansion coefficient and a low expansion alloy 75 whose thermal expansion coefficient is smaller than that of the high expansion alloy 74 are laminated. The bimetal 72 is formed in such a manner as to be curved so as to have a curvature on the high expansion alloy 74 side. The pushing-up member 71 is secured to the low expansion alloy 75 side at one end portion 76 of the bimetal 72. The bimetal 72 and the pushing-up member 71 secured to the bimetal 72 are disposed in a fourth recess portion 78 which continues to the first recess portion 20 of the base body 17 and is formed on the side opposite to the side where the substrate 15 is disposed. The bimetal 72 is disposed such that its side having the curvature faces a bottom surface 79 of the fourth recess portion 78, and the other end portion of the bimetal 77 is fixed to the bottom surface 79 by means of the threaded member 49.

When heating is effected in the heat treatment furnace 11, since the thermal expansion coefficient of the high expansion alloy 74 is larger than the thermal expansion coefficient of the low expansion alloy 75, the bimetal 72 is deformed such that its curvature becomes large, so that the pushing-up member 71 is driven in the direction in which it moves away from the base body 17 (upward as viewed in FIG. 6). If the thermal expansion coefficients of the high expansion alloy 74 and the low expansion alloy 75 are respectively set so that the chip 13 can be moved to a position where the entire surface, facing the substrate 15, of the solder 12 disposed on the chip 13 is able to come into contact with the substrate 15 in the state in which heating is effected to a temperature exceeding the melting point of the solder 12 and the solder 12 is melted, it is possible to attenuate the angle of inclination □1 of the substrate 15 with respect to the chip 13 in the state in which the solder 12 is melted.

Figure 7:
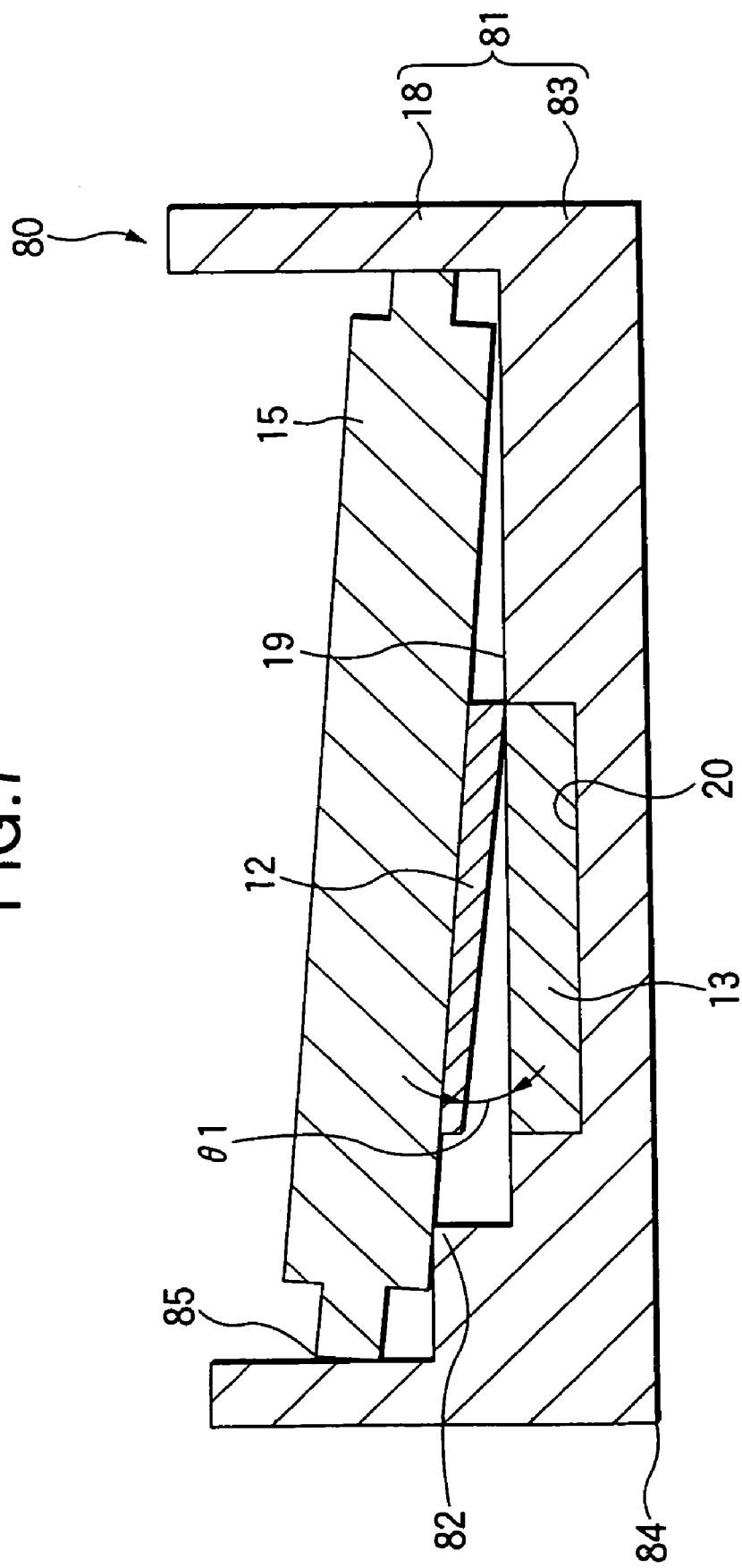
FIG. 7 is a schematic cross-sectional view illustrating in a simplified form the configuration of a die bonding apparatus 80 in accordance with a sixth embodiment of the invention.

FIG. 7 is a schematic cross-sectional view simply illustrating the configuration of a die bonding apparatus 80 in accordance with a sixth embodiment of the invention. The die bonding apparatus 80 in this embodiment is similar to the die bonding apparatus 10 in accordance with the first embodiment, so that corresponding parts will be denoted by the same reference numerals, and a description thereof will be omitted. The die bonding apparatus 80 in this embodiment includes the substrate 15 which faces the surface of the chip 13 to be die bonded, has the solder 12 on its surface facing the chip 13, and is disposed in such a manner as to be inclined with respect to the chip 13, as well as a base portion 81 for mounting the chip 13 thereon in a predetermined position, an inclination holding portion 82 being formed on the base portion 81 so as to abut against the substrate 15 and hold the state of inclination of the substrate 15 with respect to the chip 13.

In this embodiment, the solder 12 is disposed on the surface of the substrate 15 to be die bonded, i.e., the surface thereof on the side which faces the chip 13. This can be realized by applying high-viscosity soldering flux to the surface of the substrate 15 to be die bonded and by attaching the foil-like solder 12 to the substrate 15 by making use of the high viscosity of the flux. On a base body 83 included in the base portion 81, the inclination holding member 82 which is elevated from the base-body upper surface 19 in a stepped form in terms of its cross section is formed in the vicinity of one end portion 84 of the base body 83. The inclination holding portion 82 abuts against the vicinity of one end portion 85 of the substrate 15 and holds the state in which the substrate 15 is inclined with respect to the chip 13 at the angle □1.

When the chip 13, the solder 12, the substrate 15, and the base portion 81 are loaded into the heat treatment furnace 11 and are heated, the solder 12 provided on the surface of the substrate 15 to be die bonded melts, and the molten solder 12 attracts the chip toward the substrate 15 side by its wettability and surface tension. In the process in which the chip 13 is attracted toward the substrate 15 side, the gas which causes the occurrence of bubbles is removed from the molten solder 12. By virtue of such a simple construction in which the inclination holding portion 82 is formed on the base portion 81, it is possible to realize the holding of the inclination of the substrate 15 with respect to the chip 13 and form a preferable soldered portion in which bubbles are few.

Figure 8:
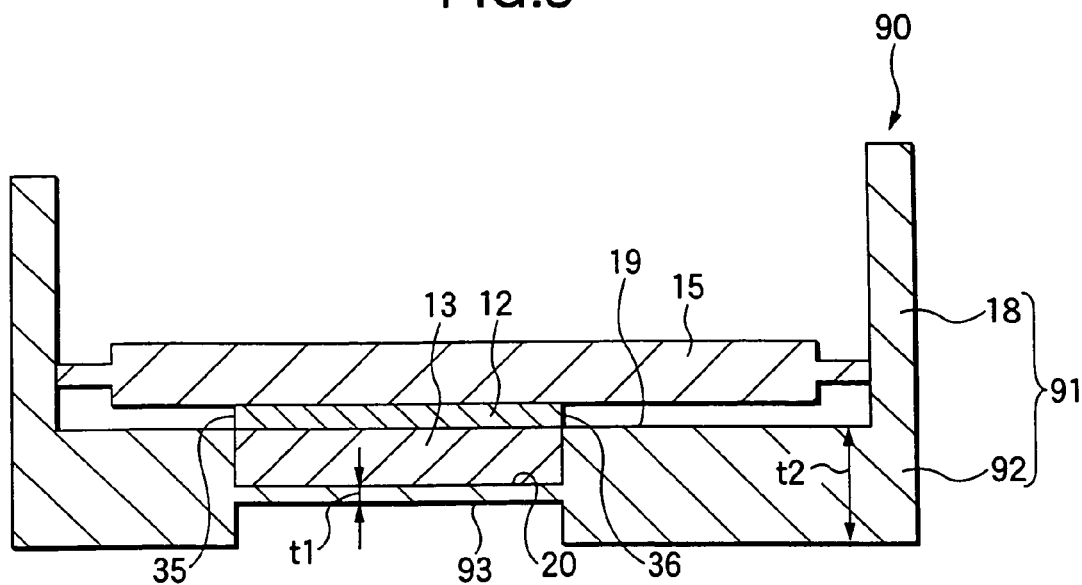
FIG. 8 is a schematic cross-sectional view illustrating in a simplified form the configuration of a die bonding apparatus 90 in accordance with a seventh embodiment of the invention.

FIG. 8 is a schematic cross-sectional view simply illustrating the configuration of a die bonding apparatus 90 in accordance with a seventh embodiment of the invention. The die bonding apparatus 90 in this embodiment is similar to the die bonding apparatus 10 in accordance with the first embodiment, so that corresponding parts will be denoted by the same reference numerals, and a description thereof will be omitted. A point to be noted in comparison with the die bonding apparatus 10 in accordance with the first embodiment is that a base portion 91, in which the chip 13 is mounted in the first recess portion 20 located in a predetermined position, is formed such that the temperature in the vicinity of a central portion of the base portion 91 in its longitudinal direction, which is a predetermined direction, becomes higher than that of the base portion 91 in the vicinity of end portions thereof. It should be noted that in this embodiment the substrate 15 is not inclined with respect to the chip 3, and the chip 13 and the substrate 15 are disposed in such a manner as to oppose each other substantially in parallel with the solder 12 interposed therebetween.

In a base body 92 formed substantially in the shape of a rectangular parallelepiped for making up the base portion 91, a groove portion 93 is formed on the side away from the base-body upper surface 19 in correspondence with the position where the first recess portion 20 is formed. Since the first recess portion 20 and the groove portion 93 are formed, the thickness t1 of the vicinity of the central portion in the longitudinal direction of the base portion 14, i.e., the portion where the first recess portion 20 and the groove portion 93 are formed, is less than the thickness t2 of the vicinity of each end portion where neither the first recess portion 20 nor the groove portion 93 is formed, i.e., t1<t2.

When the chip 13, the solder 12, and the substrate 15 are disposed on the base portion 91, are loaded into the heat treatment furnace 11, and are heated, since the thickness t1 of the vicinity of the central portion of the base portion 91 is smaller than the thickness t2 of the vicinity of the end portion thereof, the thermal capacity of the vicinity of the central portion becomes smaller than that of the vicinity of the end portion, so that the temperature of the vicinity of the central portion rises earlier than that of the vicinity of the end portion. The chip 13 mounted in the first recess portion 20 is heated by thermal conduction from the thin portion of the base body 92 in which the groove portion 93 is formed and whose thickness is t1, whereas since both end portions in the longitudinal direction of the chip 13 are in contact with the thick portion of the base body 92 whose thickness is t2, these end portions are heated by being subjected to thermal conduction from those thick portions.

Accordingly, the temperature of the central portion in the longitudinal direction of the chip 3 rises earlier than that of each end portion and becomes higher, so that a temperature difference is formed. The solder 12 disposed on the chip 13 also assumes a temperature distribution similar to that of the chip 13, so that the temperature of the central portion of the solder 12 becomes higher than the temperature of both end portions 35 and 36 thereof. Consequently, melting consecutively proceeds in the solder 12 from the vicinity of its central portion toward its both end portions 35 and 36, and the gas which causes the occurrence of bubbles in the solder 12 is moved and removed from the central portion toward both end portions 35 and 36 as the melting of the solder 12 proceeds, thereby making it possible to form a sound soldered portion in which bubbles are few.

Figure 9:
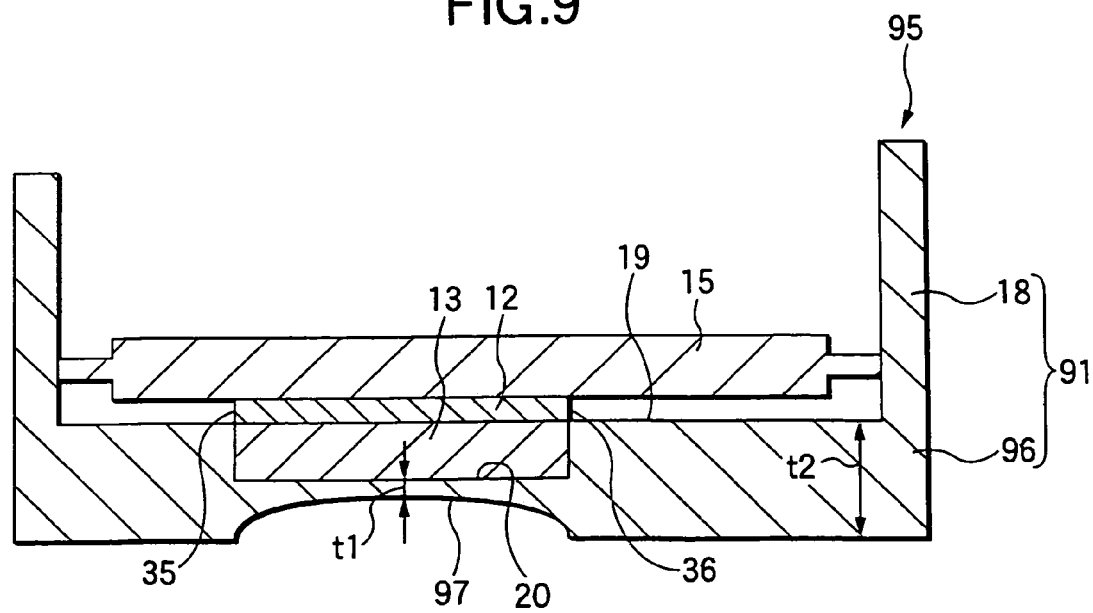
FIG. 9 is a schematic cross-sectional view illustrating in a simplified form the configuration of a die bonding apparatus 95 in accordance with an eighth embodiment of the invention.

FIG. 9 is a schematic cross-sectional view simply illustrating the configuration of a die bonding apparatus 95 in accordance with an eighth embodiment of the invention. The die bonding apparatus 95 in this embodiment is similar to the die bonding apparatus 90 in accordance with the seventh embodiment, so that corresponding parts will be denoted by the same reference numerals, and a description thereof will be omitted. A point to be noted in the die bonding apparatus 95 is that, instead of the groove portion 93 in the seventh embodiment, a recess portion 97 which is arched in its cross-sectional shape is formed in a base body 96. Since the operation of the die bonding apparatus 95 in accordance with the eighth embodiment is identical to that of the die bonding apparatus 90 in accordance with the seventh embodiment, a description thereof will be omitted.

Figure 10:
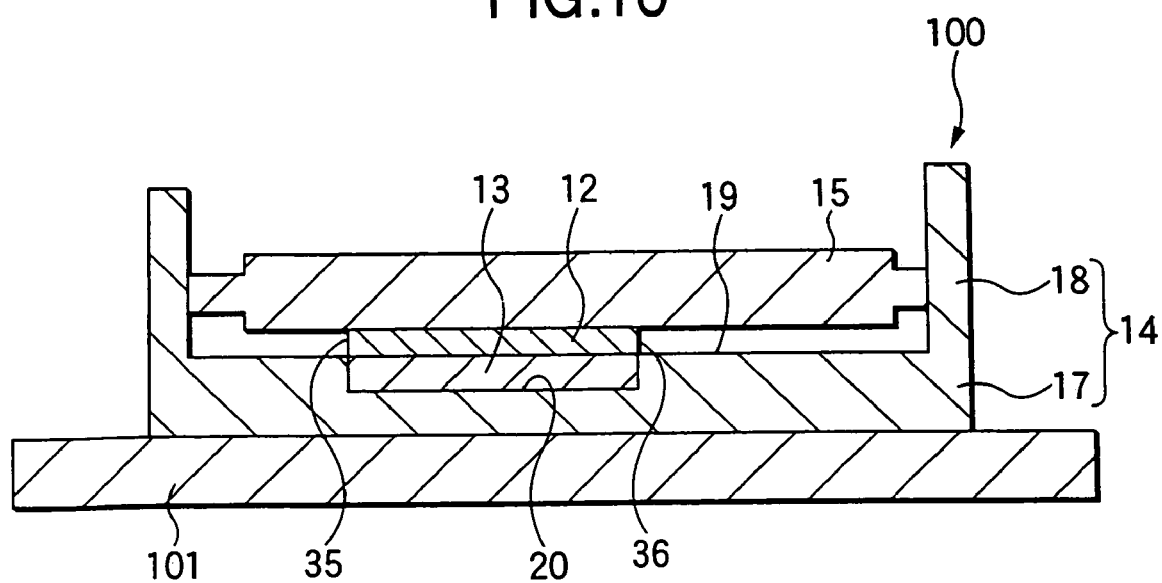
FIG. 10 is a schematic cross-sectional view illustrating in a simplified form the configuration of a die bonding apparatus 100 in accordance with a ninth embodiment of the invention.
Figure 11:
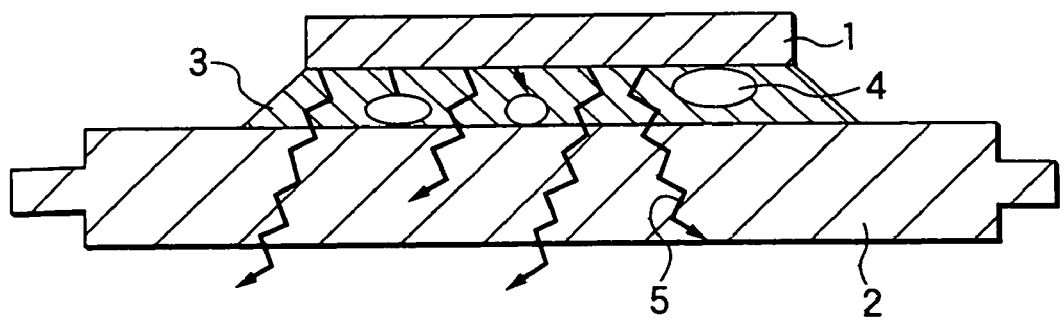
FIG. 11 is a cross-sectional view illustrating in a simplified form a state in which a chip 1 is die bonded to a substrate 2.

FIG. 10 is a schematic cross-sectional view simply illustrating the configuration of a die bonding apparatus 100 in accordance with a ninth embodiment of the invention. The die bonding apparatus 100 in this embodiment is similar to the die bonding apparatus 90 in accordance with the seventh embodiment, so that corresponding parts will be denoted by the same reference numerals, and a description thereof will be omitted. A point to be noted in the die bonding apparatus 100 is that, on an outer side of the base portion 14, a heat conducting member 101 having a thermal conductivity exceeding the thermal conductivity of the base portion 14 is provided in contact with the base portion 14.

The heat conducting member 101 is a flat plate formed of, for example, a copper alloy. The heat conducting member 101 has a thermal conductivity higher than that of the base portion 14 formed of carbon as its material, and is capable of efficiently conducting the heat from the heat treatment furnace 11 to the base portion 14. Part of the heat transmitted to the base portion 14 through the heat conducting member 101 is radiated from the base portion 14 to the atmosphere in the heat treatment furnace 11. However, since the quantity of heat radiated is small in the central portion in the longitudinal direction of the base portion 14 and is large in both end portions thereof, the temperature of the central portion rises earlier than that of both end portions in accordance with the heat balance. By virtue of such a simple construction in which the heat conducting member 101 is formed which is in contact with the base portion 14 and has a thermal conductivity higher than that of the base portion 14, it is possible to realize a temperature distribution for setting the temperature of the central portion of the base portion 14 higher than that of the end portions thereof.

The temperature distribution in which the temperature of the central portion in the longitudinal direction becomes higher than that of the end portions is formed in the chip 13 mounted on the base body 17 and in the solder 12 disposed on the chip 13. Consequently, melting consecutively proceeds in the solder 12 from the vicinity of its central portion toward its both end portions 35 and 36, and the gas which causes the occurrence of bubbles in the solder 12 is moved and removed from the central portion toward both end portions 35 and 36 as the melting of the solder 12 proceeds, thereby making it possible to form a sound soldered portion in which bubbles are few.

As described above, although in the first to ninth embodiments of the invention the arrangement provided is such that two members including the first and the second members 13 and 15 are die bonded, the invention is not limited to the same, and an arrangement may be provided such that members provided in a number exceeding two may be die bonded at the same time.

In accordance with the invention, the arrangement provided is such that inclination attenuating member is included which, in a state in which the solder is in an unmolten state, holds the second member by inclining it with respect to the first member, and which, in a state in which the solder is in a molten state, attenuates the angle of inclination of the second member with respect to the first member so as to die bond the second member and the first member. Consequently, the molten solder is filled between the first member and the second member while being consecutively pressurized by the second member from one end portion toward the other end portion of the solder. Accordingly, since the gas which causes the occurrence of bubbles is removed from the molten solder, it is possible to form a sound soldered portion in which bubbles are few.

In addition, in accordance with the invention, the inclination attenuating member is formed by a thermally fusing member, preferably another piece of solder, which melts upon being heated to a temperature exceeding the melting point of the solder. Since the thermally fusing member is a solid at a temperature below the melting point of the solder, the thermally fusing member is capable of holding the second member in an inclined manner with respect to the first member. Upon being heated to a temperature exceeding the melting point of the solder, the thermally fusing member gradually melts and its shape changes, so that the thermally fusing member is capable of attenuating the angle of inclination of the second member with respect to the first member. Thus the inclination attenuating member can be realized with such a simple construction in which the thermally fusing member is provided, and it is possible to form a sound soldered portion in which bubbles are few.

In addition, since a desired melting point can be obtained for the solder by adjusting its chemical composition, the melting points of the solder and another piece of solder serving as the inclination attenuating member can be respectively set to desired temperatures. Consequently, when heating is effected to a temperature exceeding the melting point of the solder, the other piece of solder can be melted, thereby making it possible to reliably exhibit the function of attenuating the angle of inclination of the second member with respect to the first member.

In addition, in accordance with the invention, the inclination attenuating member is formed by a heat-shrinkable member or a heat-sublimating member. Since, at a temperature below the melting point of the solder, the heat-shrinkable member and the heat-sublimating member are solids and their initial shapes are maintained, the heat-shrinkable member and the heat-sublimating member are capable of holding the second member in an inclined manner with respect to the first member. Upon being heated to a temperature exceeding the melting point of the solder, the heat-shrinkable member undergoes thermal shrinkage and its volume is reduced, while the heat-sublimating member vaporizes and its volume is reduced, so that the angle of inclination $\square 1$ of the second member with respect to the first member can be gradually attenuated. Thus the attenuation of the angle of inclination of the second member with respect to the first member can be realized with such a simple construction in which the heat-shrinkable member or the heat-sublimating member is provided, and it is possible to form a sound soldered portion in which bubbles are few.

In addition, in accordance with the invention, the inclination attenuating member includes a supporting member for supporting the second member and driving member for driving the supporting member in a direction in which the supporting member approaches the base portion. Since the angle of inclination of the second member with respect to the first member is thus attenuated by the mechanical arrangement, it is possible to use the identical inclination attenuating member repeatedly, and the reproduction of operation can be ensured positively.

In addition, in accordance with the invention, the inclination attenuating member includes a spring member for supporting the second member and compressing member for compressing the spring member. Since the angle of inclination of the second member with respect to the first member is thus attenuated by the spring member and the compressing member, it is possible to use the identical inclination attenuating member repeatedly, and the reproduction of operation can be ensured positively.

In addition, in accordance with the invention, magnetically attracting member is provided for attracting the second member by a magnetic force. In the state in which the solder is melted, the angle of inclination of the second member with respect to the first member can be attenuated by the magnetic force of the magnetically attracting member. Thus the magnetically attracting member can be used repeatedly for the attenuation of the angle of inclination of the second member, and the reproduction of operation can be ensured reliably.

In addition, in accordance with the invention, the die bonding apparatus includes a pushing-up member whose one end portion abuts against the first member and pushing-up driving member for driving the pushing-up member in a direction in which the pushing-up member moves away from the base portion, and the pushing-up member driven by the pushing-up driving member moves the first member toward the second member to die bond the first member and the second member. Since the first member is moved toward the second member with such a mechanical arrangement, the pushing-up member and the pushing-up driving member can be used repeatedly, and the reproduction of operation can be ensured reliably.

In addition, in accordance with the invention, on the base portion for mounting the first member thereon in a predetermined position, an inclination holding portion is formed so as to abut against the second member and hold the state of inclination of the second member with respect to the first member. Thus the holding of the inclination of the second member with respect to the first member with such a simple construction in which the inclination holding portion is formed on the base portion. By making use of the wettability and surface tension of the solder which is provided on the surface of the second member to be die bonded and which is in a molten state upon heating, the first member is gradually attracted toward the second member side, thereby making it possible to remove from the solder the gas which causes the occurrence of bubbles. Hence, it is possible to form a sound soldered portion in which bubbles are few.

In addition, in accordance with the invention, in the base portion for mounting the first member thereon in a predetermined position, a temperature distribution is formed such that the temperature of a vicinity of a central portion in a predetermined direction of the base portion becomes higher than the temperature of a vicinity of an end portion of the base portion in a state in which heating is effected in the heat treatment furnace. Consequently, since the solder disposed on the surface of the first member to be die bonded consecutively melts, starting from a portion corresponding to the central portion of the base portion where the temperature is high toward a portion corresponding to an end portion of the base portion where the temperature is low. Therefore, the gas which causes the occurrence of bubbles is removed in the consecutively melting process, so that a sound soldered portion in which bubbles are few is formed.

In addition, in accordance with the invention, the base portion is formed such that the thickness of the vicinity of the central portion in the predetermined direction is smaller than the thickness of the vicinity of the end portion. Accordingly, since the quantity of heat in the central portion of the base portion becomes smaller than the quantity of heat in the end portion thereof, the temperature of the central portion rises earlier than that of the end portion. By virtue of such a simple construction in which the thickness of the central portion of the base portion is made smaller than the thickness of the end portion thereof, it is possible to realize a temperature distribution for setting the temperature of the central portion of the base portion higher than that of the end portion thereof.

In addition, in accordance with the invention, a heat conducting member having a thermal conductivity higher than the thermal conductivity of the base portion is provided in contact with the base portion. Since the quantity of heat transmitted to the base portion through the heat conducting member and thereby dissipated is small in the central portion of the base portion and is large in the end portion thereof, the temperature of the central portion rises earlier than that of the end portions in accordance with the heat balance. By virtue of such a simple construction in which the heat conducting member is provided which is in contact with the base portion and has a thermal conductivity higher than that of the base portion, it is possible to realize a temperature distribution for setting the temperature of the central portion of the base portion higher than that of the end portion thereof.

What is claimed is:

1. A die bonding apparatus for die bonding at least two members, including a first member having a surface to be die bonded on which solder is disposed and a second member disposed to face the first member in a state in which the solder disposed on the surface of the first member to be die bonded is interposed therebetween, which are heated in a heat treatment furnace, the apparatus comprising:

a base portion for mounting the first member thereon in a predetermined position, wherein the base portion has a temperature distribution so that a temperature of a vicinity of a central portion in a predetermined direction of the base portion is higher than that of a vicinity of an end portion of the base portion in a state in which heating is effected in the heat treatment furnace;

wherein a heat conducting member having a thermal conductivity exceeding the thermal conductivity of the base portion is provided on an outer side of the base portion in contact with the base portion; and wherein the heat conducting member is disposed below the base portion and is a different member from the base portion.

2. The apparatus according to claim 1, wherein the base portion is formed so that the thickness of the vicinity of the central portion in the predetermined direction is smaller than that of the vicinity of the end portion.

3. The apparatus according to claim 1, wherein the base portion rests on the heat conducting member, and is physically separable from the heat conducting member.

* * * * *